(12) United States Patent
Bollesen

(10) Patent No.: US 6,381,844 B1
(45) Date of Patent: May 7, 2002

(54) METHOD FOR THERMALLY CONNECTING A HEAT SINK TO A CABINET

(75) Inventor: Vernon P. Bollesen, Milpitas, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/464,330

(22) Filed: Dec. 15, 1999

(51) Int. Cl.[7] ............................................. B21D 53/02
(52) U.S. Cl. ..................... 29/890.03; 29/450; 165/80.3; 165/185; 361/710; 257/718; 257/719
(58) Field of Search .............................. 29/450, 890.03; 165/80.3, 185; 361/704, 707, 710, 715, 690; 257/718, 719, 726, 727; 174/16.3

(56) References Cited

U.S. PATENT DOCUMENTS

| | | | |
|---|---|---|---|
| 2,965,819 A | * 12/1960 | Rosenbaum | 165/80.3 |
| 3,364,987 A | * 1/1968 | Bylund et al. | 165/80.3 |
| 4,770,242 A | * 9/1988 | Daikoku et al. | 165/185 |
| 4,972,294 A | 11/1990 | Moses, Jr. et al. | 361/386 |
| 5,010,949 A | * 4/1991 | Dehaine | 165/185 |
| 5,022,462 A | 6/1991 | Flint et al. | 165/80.4 |
| 5,036,384 A | 7/1991 | Umezawa | 357/82 |
| 5,077,638 A | 12/1991 | Andersson et al. | 361/388 |
| 5,162,974 A | 11/1992 | Currie | 361/385 |
| 5,208,731 A | 5/1993 | Blomquist | 361/386 |
| 5,253,702 A | 10/1993 | Davidson et al. | 165/80.4 |
| 5,276,585 A | 1/1994 | Smithers | 361/704 |
| 5,283,467 A | 2/1994 | Goeschel et al. | 257/718 |
| 5,307,239 A | 4/1994 | McCarty et al. | 361/704 |
| 5,329,426 A | 7/1994 | Villani | 361/719 |
| 5,329,993 A | 7/1994 | Ettehadieh | 165/104.14 |
| 5,343,362 A | 8/1994 | Solberg | 361/710 |
| 5,367,193 A | 11/1994 | Malladi | 257/707 |
| 5,373,099 A | 12/1994 | Boitard et al. | 174/16.3 |
| 5,423,375 A | 6/1995 | Chiou | 165/80.3 |
| 5,570,271 A | 10/1996 | Lavochkin | 361/704 |
| 5,576,932 A | * 11/1996 | Bishop et al. | 165/80.3 |
| 5,586,005 A | 12/1996 | Cipolla et al. | 361/719 |
| 5,621,244 A | 4/1997 | Lin | 257/713 |
| 5,699,229 A | 12/1997 | Brownell | 361/719 |
| 5,705,850 A | 1/1998 | Ashiwake et al. | 257/714 |
| 5,748,446 A | 5/1998 | Feightner et al. | 361/709 |
| 5,751,062 A | 5/1998 | Daikoku et al. | 257/722 |
| 5,761,041 A | 6/1998 | Hassanzadeh et al. | 361/704 |
| 5,847,928 A | 12/1998 | Hinshaw et al. | 361/704 |
| 5,870,286 A | * 2/1999 | Butterbaugh et al. | 361/704 |
| 5,873,406 A | * 2/1999 | Horng | 165/80.3 |
| 5,881,800 A | 3/1999 | Chung | 165/80.3 |
| 5,884,692 A | 3/1999 | Lee et al. | 165/80.3 |
| 5,926,369 A | 7/1999 | Ingraham et al. | 361/699 |
| 5,944,093 A | 8/1999 | Viswanath | 165/104.26 |
| 5,959,350 A | 9/1999 | Lee et al. | 257/712 |
| 5,978,223 A | * 11/1999 | Hamilton et al. | 361/704 |
| 5,991,151 A | 11/1999 | Capriz | 361/704 |

FOREIGN PATENT DOCUMENTS

| | | |
|---|---|---|
| JP | 53-113354 | 10/1978 |
| JP | 54-20669 | 2/1979 |
| JP | 57-147255 | 11/1982 |

* cited by examiner

*Primary Examiner*—P. W. Echols
*Assistant Examiner*—Jermie E. Cozart
(74) *Attorney, Agent, or Firm*—Gunnison, McKay & Hodgson, L.L.P.; Serge J. Hodgson

(57) ABSTRACT

A heat sink structure includes a lower heat sink in thermal contact with a heat emitting component. The heat sink structure further includes an upper heat sink and at least one heat pipe extending from the lower heat sink to the upper heat sink. At least one spring urges the upper heat sink away from the lower heat sink and into thermal contact with a cabinet, sometimes called a cover or a lid, of a computer system. During use, the heat emitting component generates heat. This heat is conducted to the lower heat sink, the upper heat sink, and the cabinet. The cabinet dissipates heat to the outside of the computer system.

17 Claims, 5 Drawing Sheets

METHOD FOR THERMALLY CONNECTING A HEAT SINK TO A CABINET

This application is related to Bollesen, co-filed and commonly assigned U.S. patent application Ser. No. 09/464,321, entitled "CABINET ASSISTED HEAT SINK", which is herein incorporated by reference in its entirety.

FIELD OF THE INVENTION

The present invention relates generally to cooling of electronic components in electronic devices. More particularly, the present invention relates to the removable attachment of a heat sink structure to a cabinet of an electronic device.

BACKGROUND OF THE INVENTION

As the art moves towards higher power integrated circuits and components, hereinafter referred to as heat emitting components, heat transfer from the heat emitting components becomes increasingly difficult and more important. One conventional technique to remove heat from a heat emitting component is to employ a finned heat sink which is placed in thermal contact with the heat emitting component. In this manner, heat generated by the heat emitting component is conducted to the heat sink and then dissipated to the ambient environment.

Hassanzadeh et al., U.S. Pat. No. 5,761,041, which is herein incorporated by reference in its entirety, teaches a finned heat sink which is placed in thermal contact with a heat emitting component. To mount the heat sink, a bolster plate is positioned below a printed circuit board, and two pins extend up from the bolster plate, through the printed circuit board and through the base of the heat sink. A spring, engaged with the two pins, presses the heat sink into thermal contact with the heat emitting component.

Although the heat sink of Hassanzadeh et al. is suitable for its intended purpose, in some applications, there is only limited space for the heat sink. In these applications, the size of the heat sink which can be placed in the limited space is not adequate to sufficiently cool the heat emitting component. To enhance heat transfer from the heat emitting component and heat sink in this event, additional and/or more powerful fans are often used. However, to avoid excess power consumption and to avoid exceeding noise level limits, the size of these additional and/or more powerful fans is severely restricted.

Accordingly, the art needs a method of enhancing heat transfer from a heat emitting component where there is only limited space for a heat sink and without providing additional and/or more powerful fans.

SUMMARY OF THE INVENTION

In accordance with the present invention, a heat sink structure includes a lower heat sink in thermal contact with a heat emitting component. The heat sink structure further includes an upper heat sink and at least one heat pipe extending from the lower heat sink to the upper heat sink. At least one spring urges the upper heat sink away from the lower heat sink and into thermal contact with a cabinet, sometimes called a cover or a lid, of a system such as a computer system.

During use, the heat emitting component generates heat. This heat is conducted to the lower heat sink which dissipates some of this heat to the ambient environment. Further, some of the heat is conducted from the lower heat sink to the upper heat sink through the at least one heat pipe. The upper heat sink also dissipates some of this heat to the ambient environment. At the same time, some of the heat from the upper heat sink is conducted to the cabinet.

Since the cabinet has a relatively large surface area and is exposed to the outside of the computer system which is relatively cool compared to the inside of the computer system, the cabinet is extremely effective at dissipating heat to the ambient environment, and in particular, to the outside of the computer system.

Recall that in the prior art, fans were utilized to remove heat from inside of the computer system. However, as the art moved to higher power components, the amount of heat which had to be remove from the computer system increased. This additional heat was removed by providing additional and/or more powerful fans. Disadvantageously, these additional and/or more powerful fans consumed more power which increased operating cost of the computer system. Further, these additional and/or more powerful fans resulted in an increase in noise which was detrimental to the performance of the computer system.

In contrast, a heat sink structure in accordance with the present invention removes heat from inside of a system such as a computer system directly through the cabinet and to the outside. Advantageously, this heat is removed without having to power a fan and without generating noise. Accordingly, the prior art requirement of providing additional and/or more powerful fans is eliminated.

Further, since the heat sink structure utilizes the cabinet to enhance heat dissipation from the heat emitting component, the heat sink structure is well-suited for use when only a limited amount of space is available for the heat sink, i.e., when the distance between the heat emitting component and the cabinet is relatively small.

Also in accordance with the present invention, a method includes pressing a lower heat sink into thermal contact with a heat emitting component. An upper heat sink is supported above the lower heat sink, the lower heat sink being a thermally connected to the upper heat sink. The method further includes pressing the upper heat sink against a cabinet.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
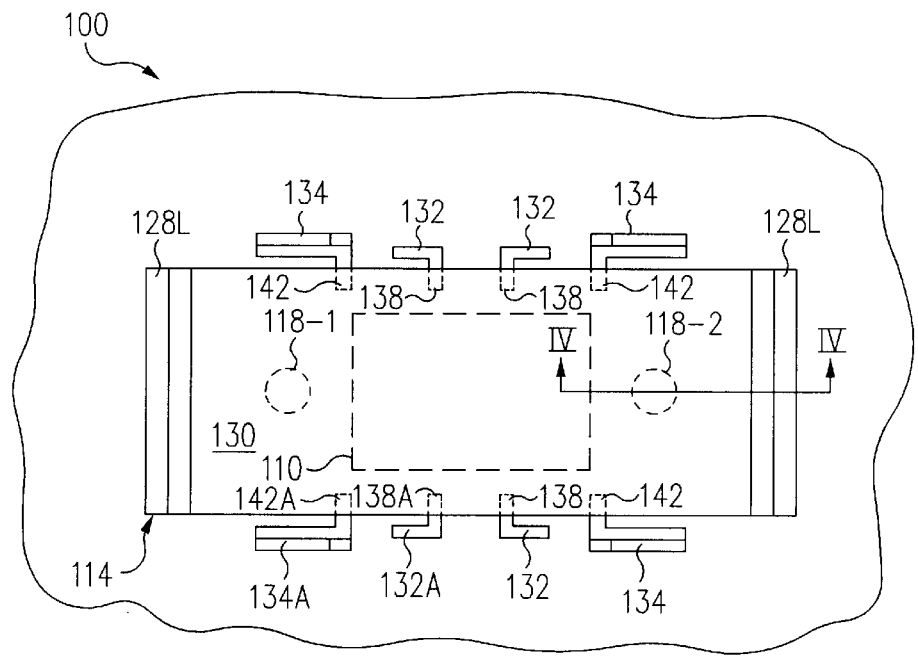
FIGS. 1 and 2 are top and side plan views, respectively, of a heat sink structure in accordance with the present invention.

In accordance with the present invention, a heat sink structure 100 (FIGS. 1, 2) includes a lower heat sink 114 in thermal contact with a heat emitting component 110. Heat sink structure 100 further includes an upper heat sink 130 and heat pipes 132 extending from lower heat sink 114 to upper heat sink 130. Springs 134 urge upper heat sink 130 away from lower heat sink 114 and into thermal contact with a cabinet 150 (FIG. 2), sometimes called a cover or a lid, of a system such as a computer system.

During use, heat emitting component 110 generates heat. This heat is conducted to lower heat sink 114 which dissipates some of this heat to the ambient environment. Further, some of the heat is conducted from lower heat sink 114 to upper heat sink 130 through heat pipes 132. Upper heat sink 130 dissipates some of this heat to the ambient environment. At the same time, some of the heat from upper heat sink 130 is conducted to cabinet 150.

Since cabinet 150 has a relatively large surface area and is exposed to the outside of the computer system, i.e., region 152, which is relatively cool compared to the inside of the computer system, i.e., region 154, cabinet 150 is extremely effective at dissipating heat to the ambient environment, and in particular, to the outside of the computer system.

Recall that in the prior art, fans were utilized to remove heat from the inside of the computer system. However, as the art moved to higher power components, the amount of heat which had to be remove from the computer system increased. This additional heat was removed by providing additional and/or more powerful fans. Disadvantageously, these additional and/or more powerful fans consumed more power which increased the operating cost of the computer system. Further, these additional and/or more powerful fans resulted in an increase in noise which was detrimental to the performance of the computer system.

In contrast, heat sink structure 100 in accordance with the present invention removes heat from inside of a system directly through cabinet 150 and to the outside. Advantageously, this heat is removed without having to power a fan and without generating noise. Accordingly, the prior art requirement of providing additional and/or more powerful fans is eliminated.

Further, since heat sink structure 100 utilizes cabinet 150 to enhance heat dissipation from heat emitting component 110, heat sink structure 100 is well-suited for use when only a limited amount of space is available for a heat sink, i.e., when the distance between heat emitting component 110 and cabinet 150 is relatively small.

Figure 2:
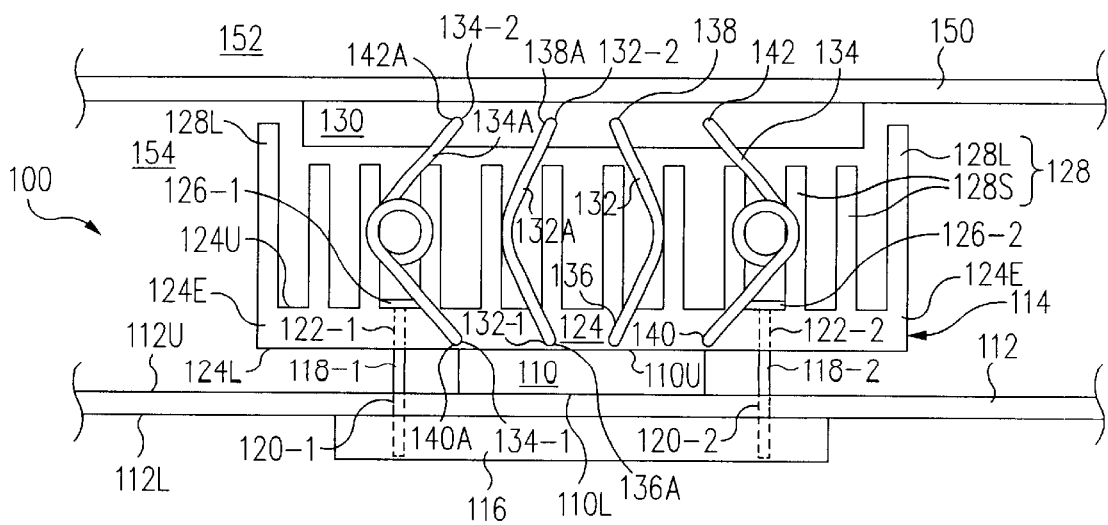

More particularly, FIGS. 1 and 2 are top and side plan views, respectively, of a heat sink structure 100 in accordance with present invention. Referring to FIGS. 1 and 2 together, a lower, e.g., first, surface 110L of a heat emitting component 110 is attached to an upper, e.g., first, surface 112U of a substrate 112 such as a printed circuit board. A lower, e.g., first, surface 124L of a base section 124 of a heat sink 114 is in thermal contact with an upper, e.g., second, surface 110U of heat emitting component 110. Heat sink 114 further includes a plurality of fins 128 extending upwards, e.g., in a first direction, from base section 124.

A bolster plate 116 is positioned opposite of heat emitting component 110 on a lower, e.g., second, surface 112L of substrate 112. Extending upward from bolster plate 116 are first and second pins 118-1, 118-2. Although two pins 118-1, 118-2 (collectively pins 118) are illustrated, in light of this disclosure, those of skill in the art will recognize that more than two pins 118 can be used, e.g., a pin 118 is located adjacent each corner of package 100 for a total of four pins 118.

Pins 118-1, 118-2 pass through apertures 120-1, 120-2 in substrate 112 and through apertures 122-1, 122-2 in base section 124 of heat sink 114, respectively. Heads 126-1, 126-2 of pins 118-1, 118-2, respectively, press downwards, e.g., in a second direction opposite the first direction, on an upper, e.g., second, surface 124U of base section 124 of heat sink 114.

Heat emitting component 110 is attached to upper surface 112U of substrate 112 in a conventional manner. For example, heat emitting component 110 is a ball grid array or a pin grid array type component. By positioning heat emitting component 110 and substrate 112 between heat sink 114 and bolster plate 116, heat sink 114 is pressed into thermal contact with heat emitting component 110.

In one embodiment, heat emitting component 110 is held in place on substrate 112 by heat sink 114. For example, heat emitting component 110 includes a land grid array type central processing unit (CPU) and a socket which is located between the CPU and substrate 112. In one embodiment, heat emitting component 110 includes a thermal pad and/or thermal grease between the CPU and heat sink 114. Suitable CPUs, sockets, thermal pads and/or thermal greases are well known to those of skill in the art and are not illustrated in the figures or discussed further for the purposes of clarity.

Positioned above heat sink 114 is an upper, e.g., second, heat sink 130. In this embodiment, upper heat sink 130 is a flat metal plate, i.e., is a plate type heat sink. Upper heat sink 130 is physically and thermally connected to heat sink 114, which is a lower, e.g., first, heat sink in this embodiment (heat sink 114 is hereinafter referred to as lower heat sink 114). More particularly, upper heat sink 130 is thermally connected to lower heat sink 114 by at least one heat pipe 132. Further, upper heat sink 130 is physically connected to lower heat sink 114 by at least one spring 134. In one embodiment, structure 100 includes four heat pipes 132 and four springs 134.

Heat pipes 132 are formed of a material having a high thermal conductivity. In one embodiment, heat pipes 132 are 0.125 inch (3.18 millimeter) diameter. In accordance with this embodiment, ends of heat pipes 132 are attached to lower and upper heat sinks 114, 130.

To illustrate, a first end 132-1 of a first heat pipe 132A of the plurality of heat pipes 132 is secured in a first aperture 136A of a plurality of apertures 136 in base section 124 of lower heat sink 114. A second end 132-2 of first heat pipe 132A is secured in a first aperture 138A of a plurality of apertures 138 in upper heat sink 130.

Ends 132-1, 132-2 are secured in apertures 136A, 138A, respectively, by friction, by an adhesive such as epoxy, by solder or by another suitable technique. However, in alternative embodiments, ends 132-1, 132-2 of heat pipe 132A are secured directly to the outer surfaces of lower and upper heat sinks 114, 130, respectively, using any one of a number of conventional techniques, for example, through the use of a pressure sensitive adhesive or solder. The other heat pipes 132 are secured to lower and upper heat sinks 114, 130 in a similar manner.

Similarly, ends of springs 134 are secured in apertures in lower and upper heat sinks 114, 130. To illustrate, a first end 134-1 of a first spring 134A of the plurality of springs 134 is secured in a first aperture 140A of a plurality of apertures 140 in base section 124 of lower heat sink 114. A second end 134-2 of first spring 134A is secured in a first aperture 142A of a plurality of apertures 142 in upper heat sink 130.

Ends 134-1, 134-2 are secured in apertures 140A, 142A, respectively, by friction, by an adhesive such as epoxy, by solder or by another suitable technique. However, in alternative embodiments, ends 134-1, 134-2 of spring 134A are secured directly to the outer surfaces of lower and upper heat sinks 114, 130, respectively, using any one of a number of conventional techniques, for example, through the use of a pressure sensitive adhesive or solder. The other springs 134 are secured to lower and upper heat sinks 114, 130 in a similar manner.

Of importance, upper heat sink 130 is in thermal contact with a cabinet 150, sometimes called a cover or a lid. To illustrate, structure 100 is part of a larger system such as a computer system, and cabinet 150 is the outer cover of this system. However, as used herein, the term cabinet generally refers to any rigid structure. Preferably, cabinet 150 has a relatively high thermal conductivity, for example, cabinet 150 is metal.

During use, heat emitting component 110 generates heat. This heat is conducted to and heats lower heat sink 114. Lower heat sink 114 dissipates some of this heat to the ambient environment. Fins 128 enhance this heat dissipation.

Further, some of the heat is conducted from lower heat sink 114 to upper heat sink 130 through heat pipes 132. Upper heat sink 130 dissipates some of this heat to the ambient environment. At the same time, some of the heat from upper heat sink 130 is conducted to cabinet 150. Since cabinet 150 has a relatively large surface area, cabinet 150 is extremely effective at dissipating heat to the ambient environment.

In one embodiment, cabinet 150 is the outer metal cover of system such as a computer system. Cabinet 150 defines an outer region 152 outside of the system and an inner region 154 inside of the system. Generally, outer region 152 is cooler than inner region 154. Since cabinet 150 is exposed directly to outer region 152, heat is readily dissipated from cabinet 150 to outer region 152, and more particularly, to outside of the system.

Further, since cabinet 150 has a large surface area and is exposed to outer region 152, a large temperature differential exists between heat emitting component 110 and cabinet 150, i.e., cabinet 150 is relatively cool compared to heat emitting component 110. As is well known to those of skill in the art, conductive heat transfer between a first item and a second item is directly proportional to the temperature differential existing between the first item and the second item. Accordingly, the large temperature differential between heat emitting component 110 and cabinet 150 drives heat from heat emitting component 110 to cabinet 150 which dissipates this heat to the ambient environment, and more particularly, to outside the system.

Recall that in the prior art, fans were utilized to remove heat from inside of the computer system. However, as the art moved to higher power components, the amount of heat which had to be removed from the computer system increased. This additional heat was removed by providing additional and/or more powerful fans. Disadvantageously, these additional and/or more powerful fans consumed more power which increased the operating cost of the computer system. Further, these additional and/or more powerful fans resulted in an increase in noise which was detrimental to the performance of the computer system.

In contrast, heat sink structure 100 in accordance with the present invention removes heat from inside of a system such as a computer system directly through cabinet 150 and to the outside environment. Advantageously, this heat is removed without having to power a fan and without generating noise. Accordingly, the prior art requirement of providing additional and/or more powerful fans is eliminated. Advantageously, operating costs are reduced and system performance is enhanced compared to the prior art.

Further, heat sink structure 100 is well suited for use when only a limited amount of space is available for a heat sink, i.e., when the distance between heat emitting component 110 and cabinet 150 is relatively small.

Of importance, heat sink structure 100 is used without making any modifications to cabinet 150. In particular, springs 134 support upper heat sink 130 when cabinet 150 is removed (or before cabinet 150 is installed). Springs 134 further ensure intimate thermal contact between upper heat sink 130 and cabinet 150 after cabinet 150 is installed as described in greater detail in reference to FIGS. 3A and 3B.

Figure 3A:
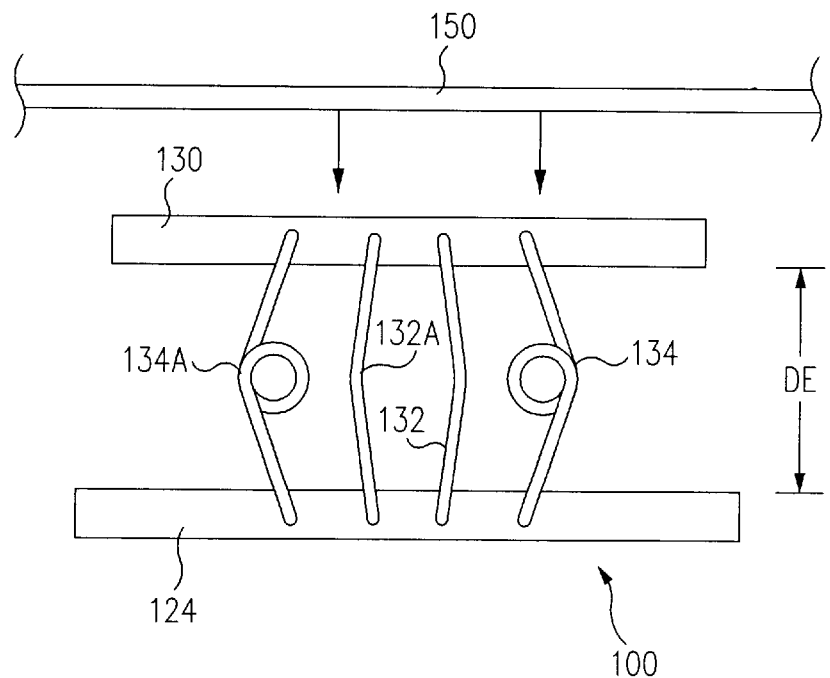
FIGS. 3A and 3B are side plan views illustrating a heat sink structure in accordance with the present invention prior to and after, respectively, installation of a cabinet.
Figure 3B:
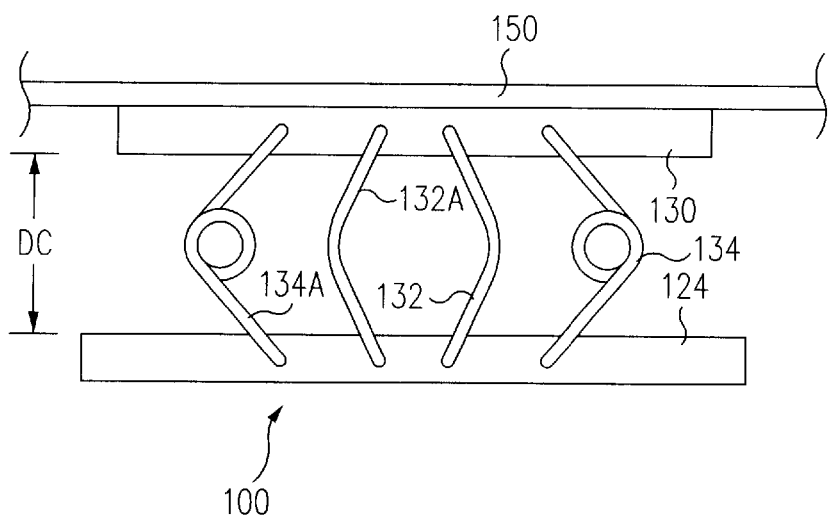

FIGS. 3A and 3B are side plan views illustrating a heat sink structure in accordance with the present invention prior to and after, respectively, installation of cabinet 150. In FIGS. 3A and 3B, only base section 124, upper heat sink 130, heat pipes 132, springs 134 and cabinet 150 are illustrated to avoid detracting from the principals of the invention.

Referring to FIG. 3A, before installation of cabinet 150, springs 134 are fully extended such that a distance DE between upper heat sink 130 and base section 124 exists. Heat pipes 132 have a sufficient length to extend from upper heat sink 130 to base section 124 of lower heat sink 114 when springs 134 are fully extended.

Of importance, upper heat sink 130 is fully supported above lower heat sink 114 by springs 134 even in the absence of cabinet 150. Referring again to FIG. 2, to prevent inadvertent horizontal motion of upper heat sink 130 relative to lower heat sink 114, the outermost fins 128L located at ends 124E of base section 124 extend upwards alongside of upper heat sink 130. In particularly, fins 128L are longer than inner fins 128S located between fins 128L.

Referring again to FIG. 3A, to install cabinet 150 to the system, cabinet 150 is moved downwards towards upper heat sink 130. Cabinet 150 contacts upper heat sink 130 and moves upper heat sink 130 along with cabinet 150 downwards towards base section 124. This compresses heat pipes 132 and springs 134 as shown in FIG. 3B. Cabinet 150 is secured in place as is well known to those of skill in the art, e.g., using screws.

Referring now to FIG. 3B, once cabinet 150 is secured in place, a distance DC between upper heat sink 130 and base section 124 exists. Since distance DC is less than distance DE between upper heat sink 130 and base section 124 when springs 134 are fully extended, springs 134 are under tension when cabinet 150 is secured in place. This tension causes springs 134 to urge upper heat sink 130 upwards away from lower heat sink 114 and against cabinet 150. By pressing upper heat sink 130 against cabinet 150, intimate thermal contact between upper heat sink 130 and cabinet 150 is achieved. Further, heat pipes 132 are made of a material having a sufficient flexibility to bend when upper heat sink 130 is moved downwards towards base section 124.

Of importance, upper heat sink 130 is not directly bolted to cabinet 150 allowing cabinet 150 to be readily removed. This simplifies servicing and avoids the possibility of damaging heat sink structure 100 by inadvertently removing cabinet 150 without first unbolted upper heat sink 130 from cabinet 150. However, in an alternative embodiment, upper heat sink 130 is bolted directly to cabinet 150.

In FIGS. 1, 2, 3A and 3B, springs 134 are illustrated as having a particular shape. However, in alternative embodiments, other types of springs are used. For example, as set forth below in FIGS. 4A and 4B, coil springs used.

Figure 4A:
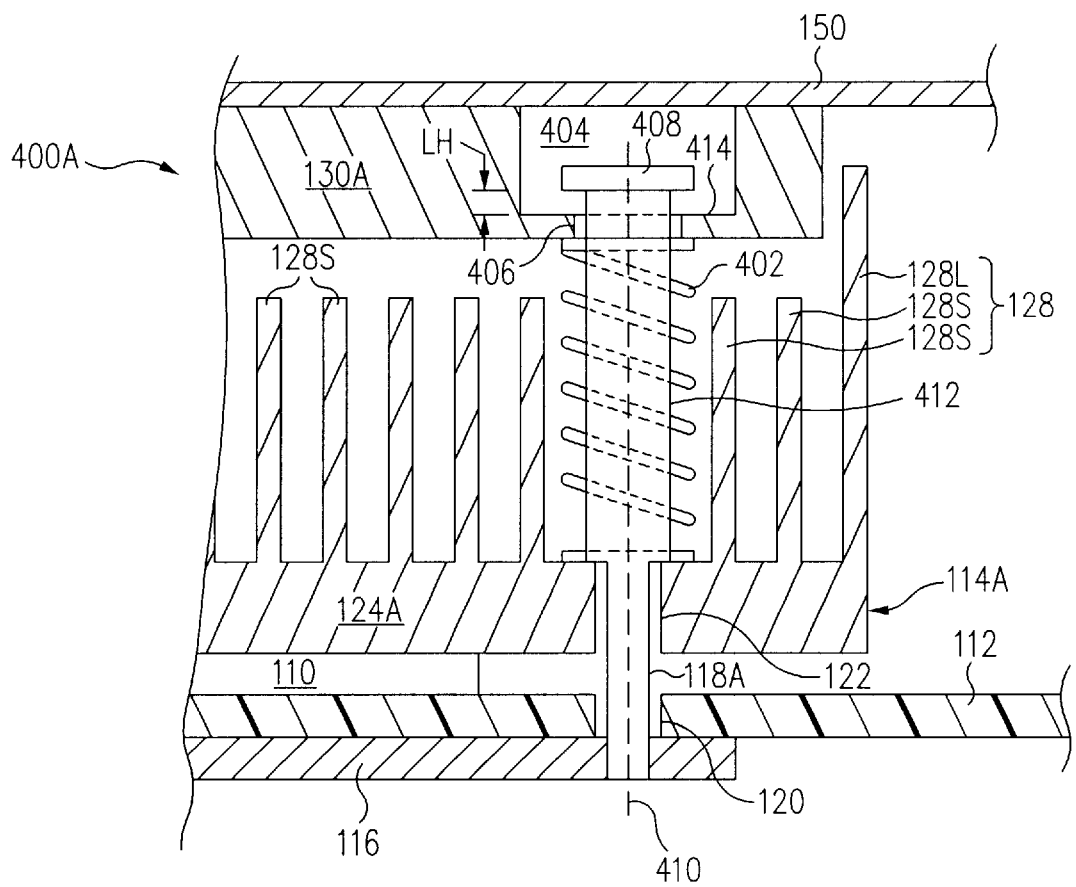
FIGS. 4A, 4B, 4C and 4D are cross-sectional views of heat sink structures along the line IV—IV of FIG. 1 in accordance with various alternative embodiments of the present invention.

FIG. 4A is a cross-sectional view of a heat sink structure 400A along the line IV—IV of FIG. 1 in accordance with an alternative embodiment of the present invention. Heat sink structure 400A of FIG. 4A is substantially similar to heat sink structure 100 of FIGS. 1 and 2 with the primary exception that springs 134 of structure 100 have been replaced with springs 402 of structure 400A. Only the relevant differences between heat sink structure 100 of FIG. 1 and heat sink structure 400A of FIG. 4A are discussed below. Further, although only a single spring 402 and pin 118A are illustrated in FIG. 4A and discussed below, in light of this disclosure, it is understood that a plurality of springs 402 and pins 118A are used, e.g., two or four.

Referring to FIG. 4A, an upper heat sink 130A defines a pinhead cavity 404. In accordance with this embodiment, a pin 118A extends upwards from bolster plate 116 through an aperture 120 of substrate 112, through an aperture 122 of a base section 124A of a lower heat sink 114A, through an aperture 406 of upper heat sink 130A and into pinhead cavity 404.

Pinhead cavity 404 has a diameter greater than a diameter of a head 408 of pin 118A so that upper heat sink 130A has freedom to move in the vertical direction. However, head 408 of pin 118A has a diameter greater than a diameter of aperture 406 of upper heat sink 130A. In this manner, the freedom of upper heat sink 130A to move in the vertical direction is limited. More particularly, upper heat sink 130A is free to move downwards (although spring 402 will resist this motion as discussed further below) until upper heat sink 130A contacts fins 128S and is free to move upwards until upper heat sink 130A contacts head 408 of pin 118A.

Spring 402, e.g., a coil spring, surrounds pin 118A such that pin 118A and spring 402 have a common longitudinal axis 410. In this embodiment, pin 118A has a pin portion 412 which has an outer diameter approximately equal to, but slightly smaller than, the inner diameter of spring 402. Pin portion 412 extends between head 408 and base section 124A in this embodiment.

Spring 402 presses downwards against base section 124A of lower heat sink 114A and upwards against upper heat sink 130A. As a result, spring 402 urges upper heat sink 130A upwards and away from lower heat sink 114A.

Prior to installation of cabinet 150, spring 402 urges upper heat sink 130A, and more particularly, urges a landing 414 of pinhead cavity 404, against head 408 of pin 118A. Advantageously, upper heat sink 130A is supported by pin 118A in combination with spring 402 when cabinet 150 is removed (or before cabinet 150 is installed).

In a manner similar to that described in reference to FIGS. 3A and 3B, upper heat sink 130A is moved downwards towards lower heat sink 114A during installation of cabinet 150. Thus, when cabinet 150 is installed as shown in FIG. 4A, a vertical distance LH between landing 414 and head 408 is equal to the distance which upper heat sink 130A moved downwards during installation of cabinet 150. Spring 402 continues to press upper heat sink 130A upwards and into intimate thermal contact with cabinet 150.

To assemble heat sink structure 400A of FIG. 4A, pin 118A is passed downwards through aperture 406 of upper heat sink 130A. Pin 118A is then passed through spring 402, through aperture 122 in base section 124A and through aperture 120 in substrate 112. Pin 118A is attached to bolster plate 116 using any one of a number of conventional techniques. For example, pin 118A is screwed or riveted into bolster plate 116.

As pin 118A is attached to bolster plate 116, lower heat sink 114A is simultaneously pressed into thermal contact with heat emitting component 110. In one embodiment, pin portion 412 of pin 118A has a greater diameter than aperture 122 in base section 124A. In this embodiment, as pin 118A is attached to bolster plate 116, pin portion 412 and spring 402 press downwards against base section 124A. This, in turn, causes lower heat sink 114A to press downwards against heat emitting component 110.

Figure 4B:
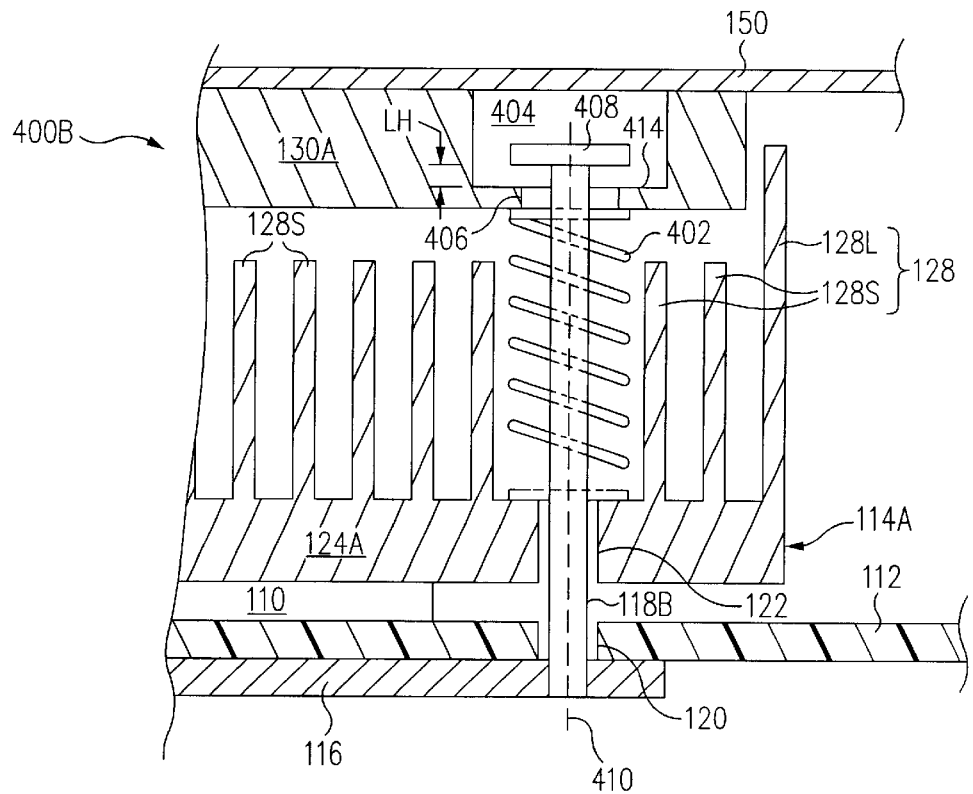

FIG. 4B is a cross-sectional view of a heat sink structure 400B along the line IV—IV of FIG. 1 in accordance with an alternative embodiment of the present invention. In this embodiment, pin 118B has a single diameter which is smaller than the diameter of aperture 122 in base section 124A. Thus, pin 118B does not press down on base section 124A. Instead, as pin 118B is attached to bolster plate 116, spring 402 is compressed between base section 124A and upper heat sink 130A. Due to the compression of spring 402, spring 402 causes lower heat sink 114A to press downwards on heat emitting component 110.

Since spring 402 is compressed between upper heat sink 130A and lower heat sink 114A, spring 402 exerts an equal and opposite force on both upper heat sink 130A and lower heat sink 114A. This allows the force exerted by lower heat sink 114A on heat emitting component 110 and the force exerted by upper heat sink 130A on cabinet 150 to be readily controlled by selecting an appropriate spring 402. However, in some applications, it may be desirable to have the force exerted by lower heat sink 114A on heat emitting component 110 to be different than the force exerted by upper heat sink 130A on cabinet 150.

Figure 4C:
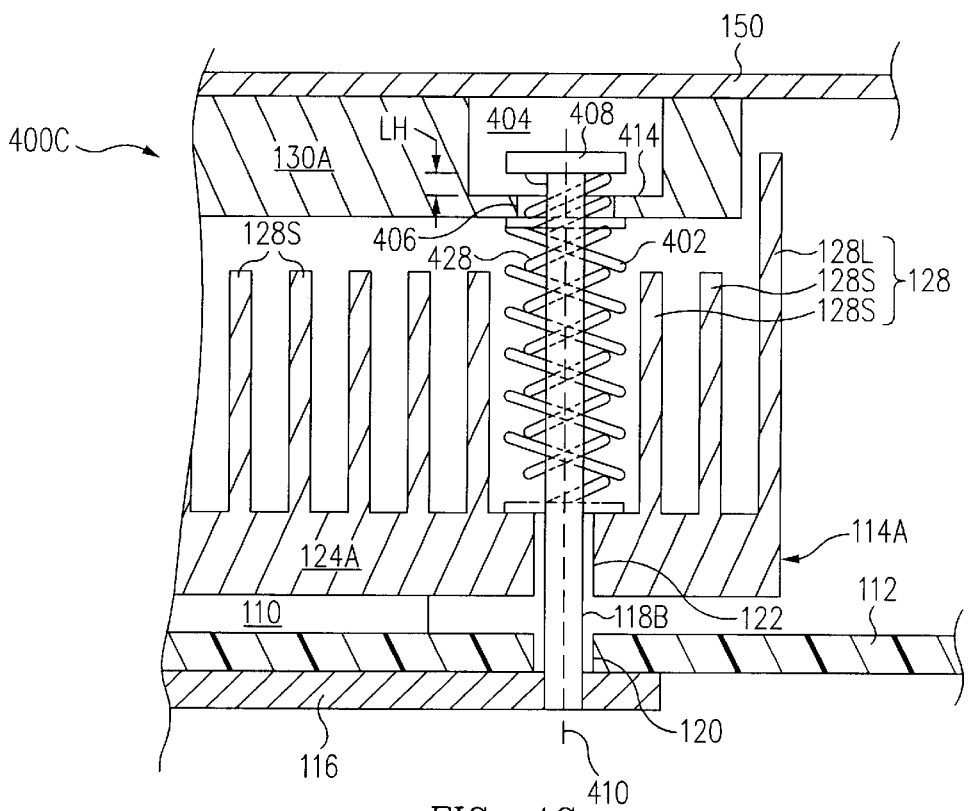

FIG. 4C is a cross-sectional view of a heat sink structure 400C along the line IV—IV of FIG. 1 in accordance with another embodiment of the present invention. Heat sink structure 400C of FIG. 4C is substantially similar to heat sink structure 400B of FIG. 4B except that in FIG. 4C an additional inner spring 428 is used.

Referring to FIG. 4C, inner spring 428, e.g., a coil spring, has an inner diameter greater than the diameter of pin 118B. Further, inner spring 428 has an outer diameter less than the diameter of aperture 406 of upper heat sink 130A and greater than the diameter of aperture 122. Accordingly, inner spring 428 surrounds pin 118B and extends between head 408 of pin 118B and base section 124A of lower heat sink 114A.

The outer diameter of inner spring 428 is also less than the inner diameter of spring 402 such that spring 402, inner spring 428 and pin 118B have a common longitudinal axis 410. Further, spring 402 and inner spring 428 are capable of being compressed independently. In particular, spring 402 is compressed between lower heat sink 114A and upper heat sink 130A and inner spring 428 is compressed between head 408 and lower heat sink 114A.

In this embodiment, as pin 118B is attached to bolster plate 116, inner spring 428 is compressed between head 408 of pin 118B and base section 124A. Due to the compression of inner spring 428, inner spring 428 causes lower heat sink 114A to press downwards on heat emitting component 110. At the same time, spring 402 is compressed between base section 124A and upper heat sink 130A. Thus, spring 402 exerts an equal and opposite force on both upper heat sink 130A and lower heat sink 114A.

As a net result, the force exerted by lower heat sink 114A on heat emitting component 110 is controlled by the combination of spring 402 and inner spring 428 together. In contrast, the force exerted by upper heat sink 130A on cabinet 150 is controlled by spring 402 alone. By appropriately selecting spring 402 and inner spring 428, these forces are readily controlled.

Figure 4D:
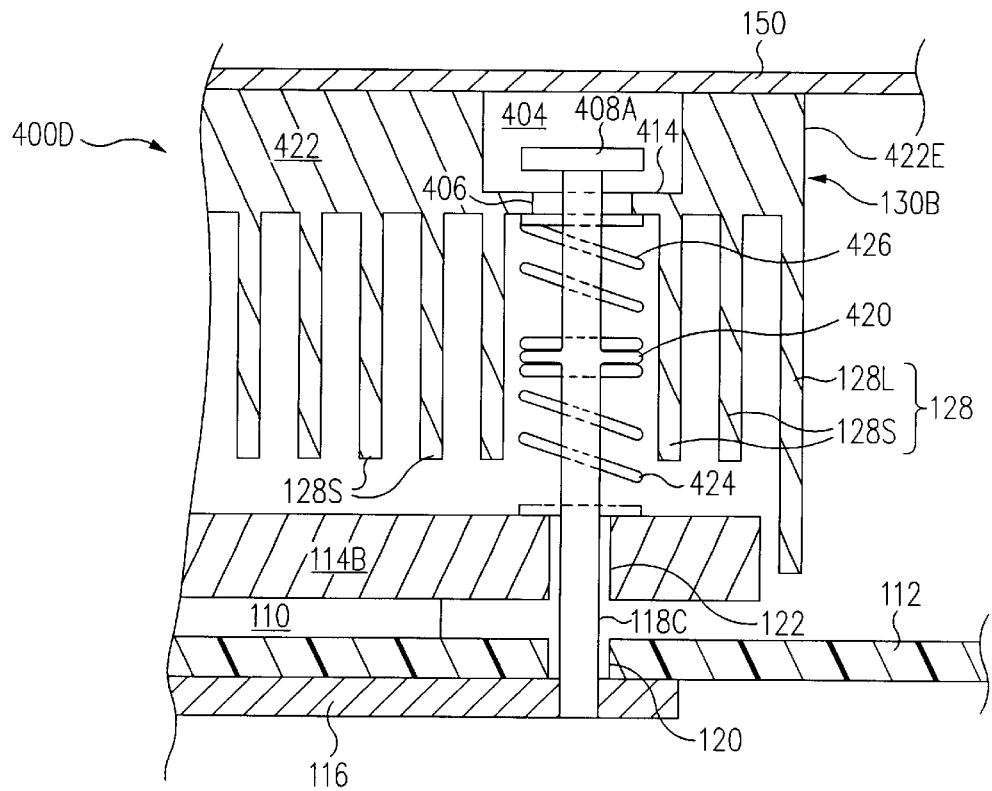

FIG. 4D is a cross-sectional view of a heat sink structure 400D along the line IV—IV of FIG. 1 in accordance with an alternative embodiment of the present invention. Heat sink structure 400D of FIG. 4D is substantially similar to heat sink structure 400B of FIG. 4B only the relevant differences between heat sink structure 400B of FIG. 4B and heat sink structure 400D of FIG. 4D are discussed below.

Referring to FIG. 4D, a pin 118C includes a stop 420 located between a lower heat sink 114B and a base section 422 of an upper heat sink 130B. Located and compressed between stop 420 and lower heat sink 114B is a lower heat sink spring 424. Lower heat sink spring 424 presses lower heat sink 114B downwards against heat emitting component 110. Similarly, located and compressed between stop 420 and upper heat sink 130B is an upper heat sink spring 426. Upper heat sink spring 426 urges upper heat sink 130B upwards away from lower heat sink 114B and thus presses upper heat sink 130B upwards against cabinet 150.

Advantageously, the force exerted by lower heat sink 114B against heat emitting component 110 is independent of the force exerted by upper heat sink 130B against cabinet 150. In particular, lower heat sink spring 424 determines the force exerted by lower heat sink 114B against heat emitting component 110 and upper heat sink spring 426 determines the force exerted by upper heat sink 130B against cabinet 150. By appropriately selecting lower heat sink spring 424 and upper heat sink spring 426, these forces are readily controlled.

To assemble heat sink structure 400D, pin 118C is passed downwards through lower heat sink spring 424, through aperture 122 in lower heat sink 114B and through aperture 120 in substrate 112. Pin 118C is attached to bolster plate 116. A head 408A is threadedly connected to pin 118C in a conventional manner and is detachable. Head 408A is detached from pin 118C if not already detached. Upper heat sink spring 426 is passed downwards over pin 118C. Upper heat sink 130B is moved downwards so that pin 118C passes through aperture 406. Head 408A is attached to pin 118C.

In FIG. 4B, lower heat sink 114A includes a plurality of fins 128 extending upwards from base section 124A. However, in an alternative embodiment, lower heat sink 114A is a plate type heat sink and upper heat sink 130A is a fin type heat sink. To illustrate, referring now to FIG. 4D, lower heat sink 114B is a plate type heat sink and upper heat sink 130B is a fin type heat sink. In particular, upper heat sink 130B includes base section 422 and a plurality of fins 128 extending downwards from base section 422. The outermost fin 128L located at end 422E of base section 422 extends downwards alongside of lower heat sink 114B to prevent inadvertent horizontal motion of upper heat sink 130B relative to lower heat sink 114B. In particularly, fin 128L is longer than inner fins 128S. (A second outermost fin 128L is located at the end of base section 422 opposite end 422E but is not shown in the view of FIG. 4D.) However, in an alternative embodiment, lower heat sink 114B and upper heat sink 130B of FIG. 4D are a fin type heat sink and a plate type heat sink, respectively.

Figure 5:
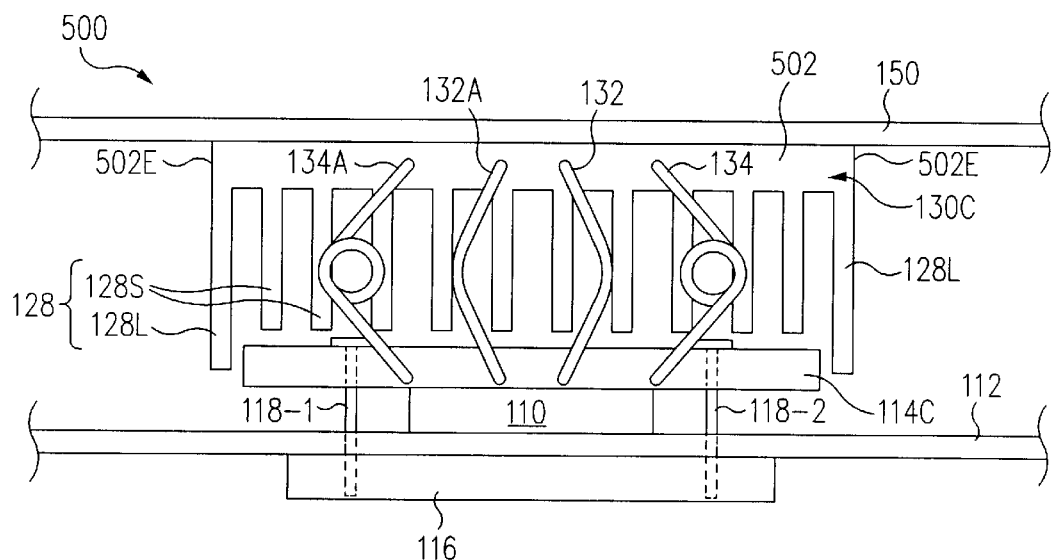
FIG. 5 is a side plan view of a heat sink structure in accordance with yet another alternative embodiment of the present invention.

FIG. 5 is a side plan view of a heat sink structure 500 in accordance with an alternative embodiment of the present invention. Heat sink structure 500 of FIG. 5 is identical with heat sink structure 100 of FIG. 2 with the exception that lower heat sink 114C and upper heat sink 130C of heat sink structure 500 of FIG. 5 are a plate type heat sink and a fin type heat sink, respectively. More particularly, referring now to FIG. 5, upper heat sink 130C includes a base section 502 and a plurality of fins 128 extending downwards from base section 500. The outermost fins 128L located at ends 502E of base section 502 extend downwards alongside of lower heat sink 114C to prevent inadvertent horizontal motion of upper heat sink 130C relative to lower heat sink 114C. In particularly, fins 128L are longer than inner fins 128S.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A method comprising:

pressing a first heat sink into thermal contact with a heat emitting component;

supporting a second heat sink above said first heat sink comprising supporting said second heat sink with at least one spring, said first heat sink being thermally connected to said second heat sink; and pressing said second heat sink against a cabinet comprising compressing said at least one spring, wherein said compressing said at least one spring comprises:

contacting said second heat sink with said cabinet; and moving said second heat sink towards said first heat sink with said cabinet.

2. The method of claim 1 wherein at least one heat pipe extends from said first heat sink to said second heat sink, said moving further comprising bending said at least one heat pipe.

3. A method comprising:

pressing a first heat sink into thermal contact with a heat emitting component;

supporting a second heat sink above said first heat sink, said first heat sink being thermally connected to said second heat sink; and pressing said second heat sink against a cabinet, wherein said cabinet is an outer cover of a computer system, said pressing said second heat sink against a cabinet comprising installing said cabinet to said computer system.

4. The method of claim 3 wherein said heat emitting component generates heat, said heat being conducted to said first heat sink, said second heat sink, and said cabinet.

5. The method of claim 3 wherein said supporting comprises supporting said second heat sink with at least one spring.

6. The method of claim 5 wherein said pressing said second heat sink against a cabinet further comprises compressing said at least one spring.

7. The method of claim 3 wherein a pin extends through an aperture of said first heat sink, through an aperture of said second heat sink and into a pinhead cavity of said second heat sink.

8. The method of claim 7 wherein said second heat sink has freedom to move towards said first heat sink until said second heat sink contacts said first heat sink and has freedom to move away from said first heat sink until said second heat sink contacts a head of said pin.

9. The method of claim 7 wherein said pin comprises a stop, said method further comprising:

compressing a first spring between said stop and said first heat sink; and compressing a second spring between said stop and said second heat sink.

10. The method of claim 9 further comprising:

controlling a force exerted by said first heat sink on said heat emitting component with said first spring; and controlling a force exerted by said second heat sink on said cabinet with said second spring.

11. A method comprising:

pressing a first heat sink into thermal contact with a heat emitting component;

supporting a second heat sink above said first heat sink, said first heat sink being thermally connected to said second heat sink; and pressing said second heat sink against a cabinet, wherein a pin extends through an aperture of said first heat sink, through an aperture of said second heat sink and into a pinhead cavity of said second heat sink, and wherein a first spring surrounds said pin, said first spring pressing said first heat sink into thermal contact with said heat emitting component.

12. The method of claim 11 wherein said first spring presses said second heat sink against said cabinet.

13. The method of claim 12 wherein said first spring exerts an equal and opposite force on said first heat sink and said second heat sink.

14. The method of claim 11 wherein said first spring has an outer diameter less than an inner diameter of a second spring, and wherein said first spring, said second spring, and said pin having a common longitudinal axis.

15. The method of claim 14 wherein said first spring extends between a head of said pin and said first heat sink.

16. The method of claim 15 wherein said first spring is compressed between said first heat sink and said head, and wherein said second spring is compressed between said first heat sink and said second heat sink.

17. The method of claim 14 further comprising:

controlling a force exerted by said first heat sink on said heat emitting component with said first spring and said second spring; and controlling a force exerted by said second heat sink on said cabinet with said second spring.

* * * * *